(12) United States Patent
Mochida et al.

(10) Patent No.: US 7,223,617 B2
(45) Date of Patent: May 29, 2007

(54) SEMICONDUCTOR LASER DEVICE AND A METHOD OF MOUNTING A SEMICONDUCTOR LASER COMPONENT ON A SUBMOUNT

(75) Inventors: Atuhito Mochida, deceased, late of Shizuoka (JP); by Korekazu Mochida, legal representative, Shizuoka (JP); by Kyoko Mochida, legal representative, Shizuoka (JP); Hiroto Inoue, Hirakata (JP); Suguru Nakao, Itami (JP); Yukihiro Iwata, Ibaragi (JP); Akira Takamori, Suita (JP); Hideto Adachi, Oakayama (JP); Masatoshi Tamura, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 559 days.

(21) Appl. No.: 10/629,544

(22) Filed: Jul. 30, 2003

(65) Prior Publication Data

US 2006/0171434 A1  Aug. 3, 2006

(51) Int. Cl.
*H01L 21/00* (2006.01)
(52) U.S. Cl. .......................... 438/25; 438/26; 438/106; 257/E33.056
(58) Field of Classification Search ........ 438/106–127, 438/25–26
See application file for complete search history.

(56) References Cited

U.S. PATENT DOCUMENTS

| 3,790,738 | A | 2/1974 | Laub et al. |
|---|---|---|---|
| 4,576,326 | A | 3/1986 | Hawrylo |
| 5,309,545 | A | 5/1994 | Spigarelli et al. |
| 5,579,979 | A | 12/1996 | Kurpiela |
| 6,142,356 | A | 11/2000 | Yamazaki et al. |
| 6,808,316 | B2* | 10/2004 | Nakanishi et al. ............ 385/88 |
| 6,827,501 | B2 | 12/2004 | Yasuda et al. |
| 6,897,410 | B1 | 5/2005 | Ho et al. |
| 2003/0015721 | A1* | 1/2003 | Slater et al. .................. 257/99 |
| 2004/0195297 | A1 | 10/2004 | Powers et al. |
| 2005/0127144 | A1* | 6/2005 | Mochida et al. ......... 228/234.1 |
| 2005/0141579 | A1 | 6/2005 | Yamane et al. |

FOREIGN PATENT DOCUMENTS

JP  2002-217480  8/2002

* cited by examiner

*Primary Examiner*—Savitri Mulpuri
(74) *Attorney, Agent, or Firm*—Wenderoth, Lind & Ponack, L.L.P.

(57) ABSTRACT

A method of mounting a semiconductor laser component capable of preventing deterioration of laser characteristics and destruction of the semiconductor laser component due to a rise in temperature and a residual stress of the semiconductor laser component. The semiconductor laser component is mounted on a submount by heating and pressure-bonding, and is heated again up to a temperature more than a melting point of a bonding member at the released pressure to release the residual stress.

7 Claims, 3 Drawing Sheets

Fig. 3 A
Fig. 3 B
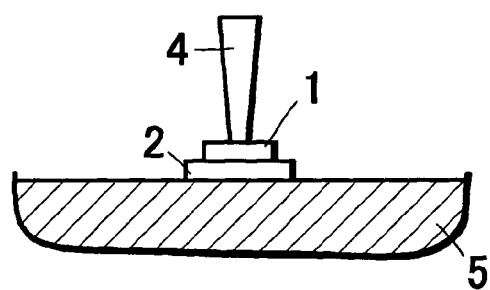
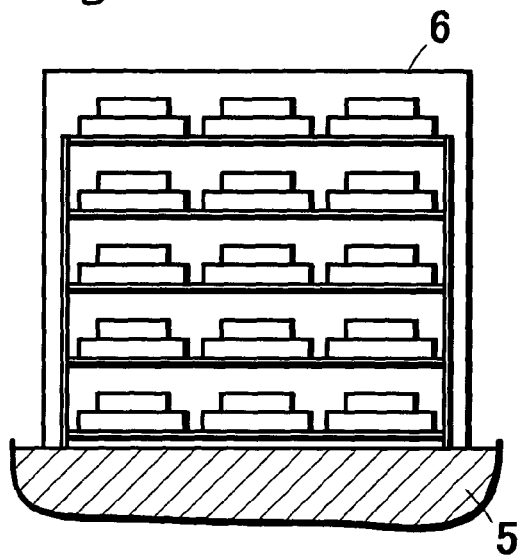
Fig. 4
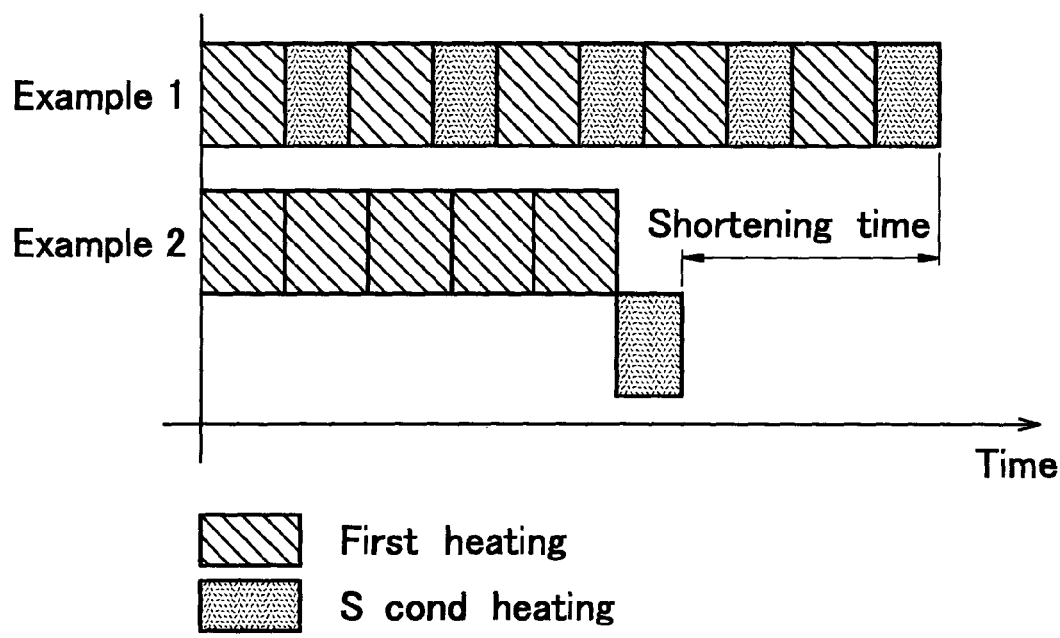

SEMICONDUCTOR LASER DEVICE AND A METHOD OF MOUNTING A SEMICONDUCTOR LASER COMPONENT ON A SUBMOUNT

BACKGROUND OF THE INVENTION

1. Field of the Invention

The present invention relates to a semiconductor laser device having a semiconductor laser component mounted thereon and a method of mounting the semiconductor laser component on a submount.

2. Description of the Related Art

When a semiconductor laser component is used in systems such as an optical communication system, an optical disk, a laser, a laser-beam printer and the like, such element is packaged suitably for its use. In packaging the semiconductor laser component, a direct bonding method of directly bonding the semiconductor laser component to a component, which is disposed in the package, such as a metal block, a circular stem, and the like can be used. However, since a structure obtained through this method is simple while the heat releasing property of the semiconductor laser component is not good, temperature thereof increases and thus a lifetime of the semiconductor laser component is shortened. For this reason, it is difficult to use the direct bonding method in a high-power semiconductor laser component.

Therefore, in order to solve the above problem, there has been a method for mounting a semiconductor laser component on a submount made of Si or SiC that is excellent in thermal conductivity and processability and also a method for bonding the resultant semiconductor laser device to a package. Recently, a bonding method using a submount having an excellent heat releasing property is widely used.

Now, a conventional method of mounting a semiconductor laser component will be described.

FIG. 1A is a view illustrating processes of mounting a semiconductor laser component, wherein reference numeral 1 indicates a semiconductor laser component, reference numeral 2 indicates a submount, reference numeral 3 indicates a bonding member made of eutectic crystal solder, reference numeral 4 indicates a collet, and reference numeral 5 indicates a heating table. First, as shown in FIG. 1A, the submount 2 is set on the heating table 5 and then the submount is heated up to a temperature of 183° C. or more at which the bonding member 3 on the submount 2 can be melted. In the meantime, the semiconductor laser component 1 is held through vacuum absorption by the collet 4, and is positioned on the mount surface of the submount 2.

Next, as shown in FIG. 1B, after the bonding member 3 is melted, the collet 4 holding the semiconductor laser component 1 descends and the semiconductor laser component 1 mounted on the bonding member 3 of the submount 2 is cooled. At that time, in order to secure sufficient bonding area between the semiconductor laser component 1 and the submount 2 sandwiching the bonding member 3 and to improve the heat conductivity by making the bonding member 3 thin, the semiconductor laser component is pressure bonded on the submount by the collet 4. Next, as shown in FIG. 1C, after the bonding member 3 is completely coagulated, the collet 4 releases the semiconductor laser component 1 and ascends.

The bonding method using the submount enables for the semiconductor laser component to be high-powered. However, the higher-powered semiconductor laser component results in enlargement of the submount, and widening of the bonding area between the semiconductor laser component 1 and the submount 2 sandwiching the bonding member 3.

In this regard, the enlargement of the submount 2 and the widening of the bonding area accompanied with the higher-powered semiconductor laser component have caused the following problems.

A volume of a substance is varied according to variation of temperature, and the rate of change (thermal expansion coefficient) of every substance is different. For this reason, when different substances (for example, semiconductor laser component and submount) are heated to bond to each other, since difference in temperature exists for a time period from the complete coagulation of the bonding member to the recovery to a normal temperature. Thus, a shearing force due to difference in thermal expansion coefficient is generated in the bonded portion and this shearing force causes a residual stress in the substances. Further, the residual stress is varied depending upon sizes and shapes of the substances and the residual stress generated in the semiconductor laser component 1 because of the following reasons increase with the enlargement of the submount 2.

FIGS. 2A to 2D are conceptual views illustrating variation in residual stress depending upon variation in size of the submount 2, in which FIGS. 2A and 2B are an overview and a conceptual view illustrating generation of stress when the submount 2 is small and FIGS. 2C and 2D are an overview and a conceptual view illustrating generation of stress when the submount 2 is large. When the thermal expansion coefficient of the semiconductor laser component 1 is larger than that of the submont 2, a force acts on the semiconductor laser component 1 in a direction of decreasing the bonding area and a force acts on the submount 2 in a direction of maintaining the bonding area.

When the submount 2 is small as in FIG. 2B, the force of maintaining the bonding area is a shearing force generated when the submount 2 below a bonding surface is compressed. When the submount 2 in FIG. 2D is larger than the submount 2 in FIG. 2B, the force of maintaining the bonding area is the shearing force generated when the submount 2 below the bonding surface is compressed and a shearing force generated when the remaining submount 2 at the periphery of the submount 2 in which the shearing force is generated is tensioned. When the semiconductor laser components 1 have the same size in the two cases, the shearing forces generated when the submount 2 is compressed are equal to each other. Therefore, the large submount 2 has the stronger force of maintaining the bonding area by the shearing force generated due to the tension, and this shearing force becomes stronger with increase in size of the submount 2. For this reason, the larger the submount 2 becomes, the stronger the shearing force acting on the semiconductor laser component 1 becomes. Therefore, the residual stress generated in the semiconductor laser component 1 increases with increase in size of the submount 2. Furthermore, the same is true of the semiconductor laser component 1 having a smaller thermal expansion coefficient.

Furthermore, if the bonding area between the semiconductor laser component 1 and the submount 2 sandwiching the bonding member 3 is made large in order to enhance the heat conductivity, the residual stress of the semiconductor laser component 1 increases for the following reasons. When the semiconductor laser component bonded to other substance is cooled, compression occurs around a center of the bonding surface. For this reason, the farther a place is from the center, the greater the difference in the amount of compression between different substances becomes and thus the shearing force becomes larger. If the bonding area increases, places away from the center are bonded, and thus the shearing force becomes larger than the area ratio. For this reason, the residual stress due to this shearing force increases.

As described above, in order to secure sufficient bonding area between the semiconductor laser component 1 and the submount 2 sandwiching the bonding member 3 and to improve the heat conductivity by making the bonding member 3 thin, the semiconductor laser component is pressure bonded on the submount by the collet 4. However, since the semiconductor laser component 1 and the submount 2 are bonded with the stress generated due to the pressure bonding, the stress due to the pressure bonding remains in the semiconductor laser component 1 even after the release of the pressure bonding by the collet 4. At that time, if the bonding area enlarges, the fluid resistance of the bonding member 3 increases and thus the force required for the pressure bonding increases. For this reason, the residual stress remaining in the semiconductor laser component 1 due to the pressure bonding increases with the enlargement of the bonding area.

In order to improve the heat releasing property, the submount 2 is bonded to the vicinity of a light emitting region of the semiconductor laser component 1. For this reason, the light emitting region is positioned at a position having a high residual stress in the semiconductor laser component 1.

In general, when current flows in the semiconductor laser component 1 by applying a stress of 100 MPa or more to the light emitting region, crystals are transposed, which deteriorates the laser characteristic or destroys the semiconductor laser component 1. This phenomenon occurs when the stress of 100 MPa or more is applied to a part of the light emitting region. In addition, the higher-powered semiconductor laser component 1 makes the residual stress in the light emitting region larger. For this reason, when current flows, the laser characteristic is deteriorated or the semiconductor laser component 1 is destroyed.

However, as described above, since the residual stress of the semiconductor laser component 1 is generated locally due to various causes and the distribution of stress varies due to sizes and shapes of the semiconductor laser component 1, the submount 2 and the collet 4, and the pressing force of the collet 4, etc. Accordingly, there is no correlation between the macroscopic deformation (bending) and the residual stress of the semiconductor laser component 1, which makes it difficult to specify the causes.

SUMMARY OF THE INVENTION

In order to solve the above problems, it is an object of the present invention to provide a method of mounting a semiconductor laser component capable of preventing deterioration of laser characteristics and destruction of the semiconductor laser component due to residual stress as well as preventing decrease of a lifetime due to increase in temperature of the semiconductor laser component.

In order to accomplish the above object, the present invention provides a method of mounting a semiconductor laser component having a light emitting portion on a submount through a bonding member, the method comprising steps of: setting the submount having a bonding member at a mount surface thereof on a heating table;

heating the submount to bring the bonding member up to a temperature more than a melting point thereof;

positioning the semiconductor laser component on the mount surface of the submount, by a collet means;

pressure-bonding the semiconductor laser component on the mount surface of the submount by the collet means; and heating again the submount on the heating table without pressure by the collet after the bonding member is completely coagulated.

According to the present invention, since the semiconductor laser component is pressure-bonded on the mount surface of the submount by the collet and then the semiconductor laser component is released from the collet after the bonding member is completely coagulated, the bonding member is very thin (the bonding member having a thickness of 4±1 μm is pressure bonded into a thickness of about 1 μm to about 1.5 μm). Thus, heat is released from the semiconductor laser component to the submount without any hindrance. Furthermore, by heating again the pressure-bonded semiconductor laser component through the submount up to a melting point of the bonding member, it is possible to decrease the residual stress of the semiconductor laser component. Therefore, the bonding area between the semiconductor laser component and the submount can be secured sufficiently, the thickness of the bonding member can be made-very thin to enhance heat conductivity, and the residual stress of the semiconductor laser component can be decreased, so that deterioration of laser characteristics and destruction of the semiconductor laser component can be suppressed. Besides, the process of heating again (second heating) decreases the residual stress without mis-registration of the bonding position and also an increase of the bonding thickness.

In the present invention, the submount may be provided with Au plating at a bonding surface area for a laser component to decrease the thermal contact resistance during the bonding process. The process of heating again should be carried out for a plurality of laser components together to shorten the mounting time, by which it is possible to improve productivity and reduce cost.

In the present invention, since a method of the first heating is different from that of the second heating, respectively, each heating is carried out suitably for each heating condition, which makes it possible to improve productivity and reduce cost.

According to the present invention, the heating of the submount can be carried out using various methods. However, by heating the submount using a hot-air heating method, the vicinity of the bonding member inherently to be heated can be concentrically heated or a plurality of submounts can be heated together without complicating a heating apparatus. Further, by directly heating the submount using an ohmic-resistance heating method, the heat quantity generated within a mounting apparatus can be decreased and the destruction due to increase in temperature of the mounting apparatus can be prevented. Furthermore, by heating the submount using a high-frequency heating method, a plurality of submounts can be heated together without complicating a heating apparatus.

According to the present invention, even if a Pb-free solder (such as Au—Sn, An—Ag—Bi—In, Sn—Zn—Bi, Sn—Bi—Ag) having a melting point higher than that of an eutectic crystal solder (Pb—Sn) is used as the bonding member, the residual stress can be released by heating again the laser components, and as a result, the Pb-free bonding can be realized.

According to the present invention, although a GaN or GaAs or AlInGaP system semiconductor element is used as the semiconductor laser component and Si or SiC is used as the submount, the residual stress does not remain in the semiconductor laser component and thus combination of both materials can be combined.

According to the present invention, since a semiconductor laser device having a semiconductor laser component mounted on a circuit board through a submount, wherein the semiconductor laser component is mounted on the submount through a bonding member including a Pb-free solder member by pressure bonding in a manner to have a residual stress due to the pressure boding the semiconductor laser device on the submount, it is possible to prevent deterioration of laser characteristics and destruction of the semiconductor laser component.

Furthermore, although the present invention is described below based on embodiments of a semiconductor laser component, the present invention is applicable to a method of mounting an electric element, similar to the semiconductor laser component, to a submount by means of pressure-bonding.

BRIEF DESCRIPTION OF THE DRAWINGS

The above and other objectives and features of the present invention will become more apparent from the following description of preferred embodiments thereof with reference to the accompanying drawings throughout which like parts are designated by like reference numerals, and wherein:

FIGS. 3A and 3B are side views illustrating a first heating process and a second heating process in Example 2; and FIG. 4 is a time-distribution view of comparing the mounting time according to Examples 1 and 2.

DESCRIPTION OF THE PREFERRED EMBODIMENTS

Now, preferred embodiments of the present invention will be described with reference to FIGS. 1, 3 and 4.

EXAMPLE 1

Figure 1:
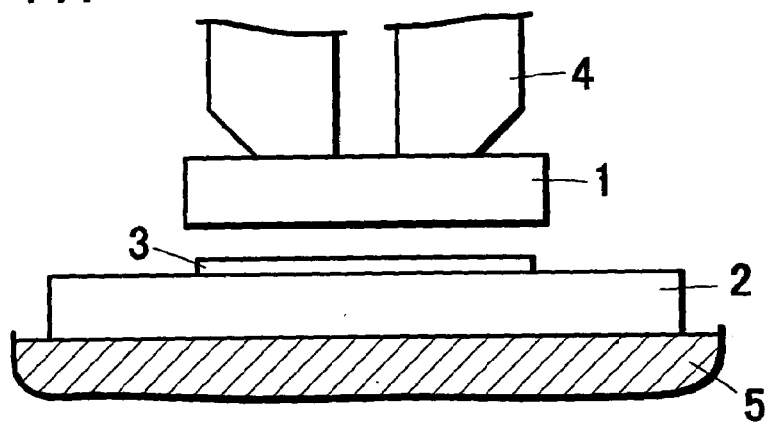
FIGS. 1A to 1C are side views illustrating processes of mounting a semiconductor laser component.
Figure 1:
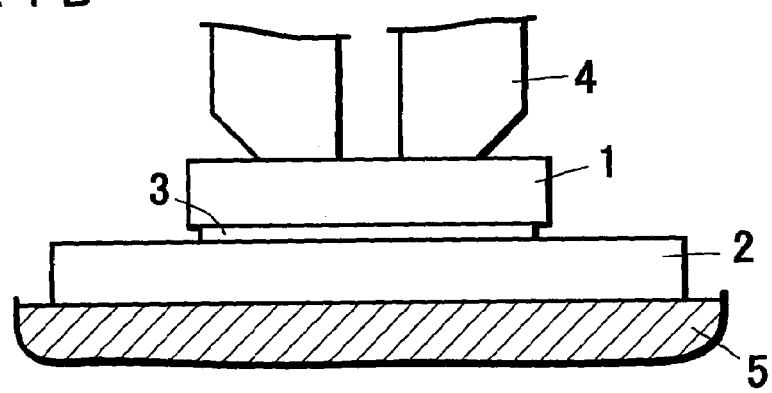
Figure 1:
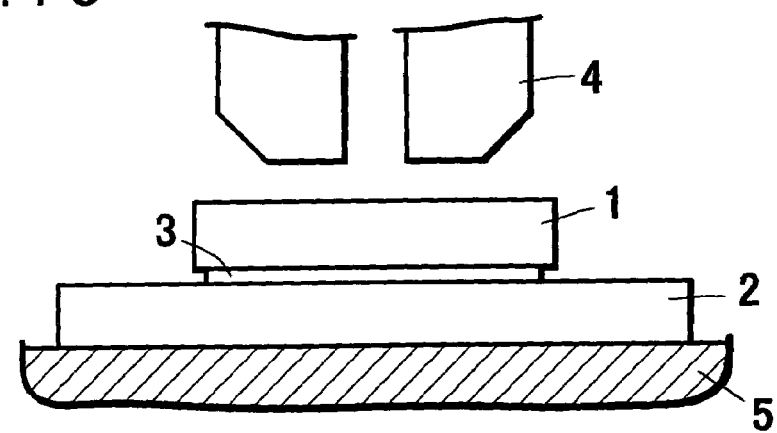
Figure 2:
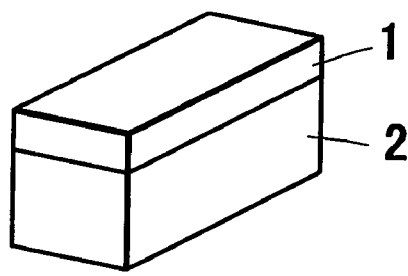
FIGS. 2A to 2D are conceptual view illustrating differences in residual stress depending upon different sizes of a submount.
Figure 2:
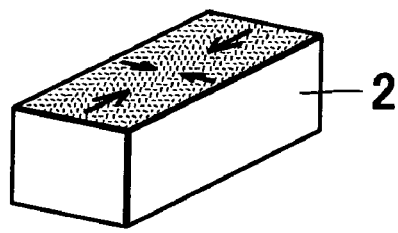
Figure 2:
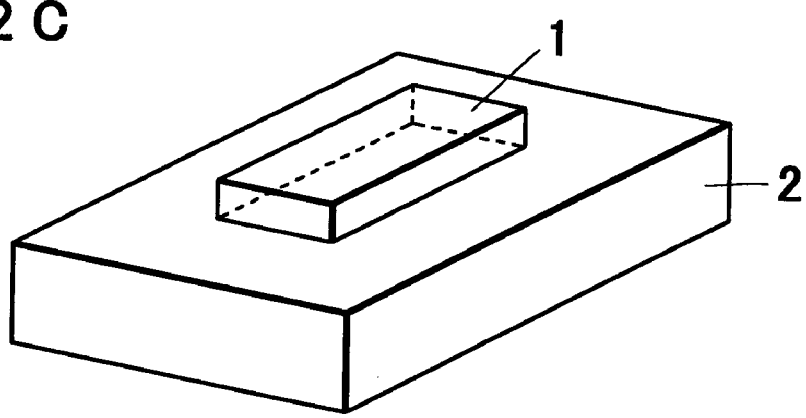
Figure 2:
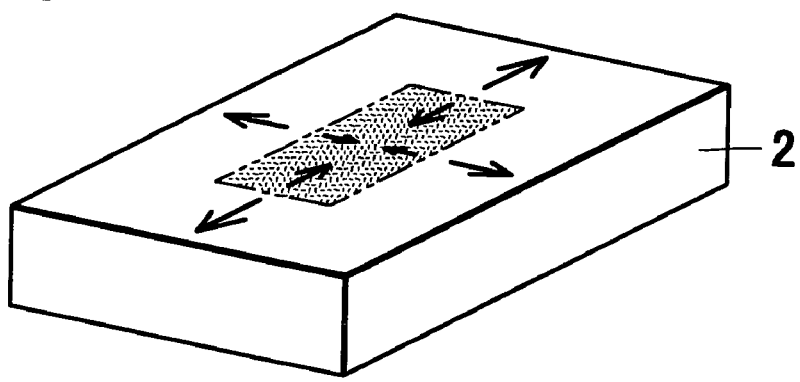

FIG. 1 is a side view illustrating processes of mounting a semiconductor laser component. The semiconductor laser device comprises a AlInGaP semiconductor laser component 1 having a light emitting portion, an SiC submount 2 for mounting the semiconductor laser component 1, and an Pb—Sn solder bonding member 3 for bonding the semiconductor laser component 1 on the mount surface of the submount 2. In the conventional mounting method, as shown in FIG. 1A, first, the submount 2 is set on a heating table 5, and the submount 2 is overheated up to a temperature more than a melting point of the bonding member 3 on the submount 2. In the meantime, a collet 4 holds the semiconductor laser component 1 through vacuum absorption, etc., and the semiconductor laser component is positioned on a mounting surface of the submount 2. Next, as shown in FIG. 1B, after the bonding member 3 is melted, the collet 4 (heat resisting steel alloy) holding the semiconductor laser component 1 descends and the semiconductor laser component 1 mounted on the bonding member 3 of the submount 2 is cooled. At that time, in order to secure enough bonding area between the semiconductor laser component 1 and the submount 2 sandwiching the bonding member 3 and to improve the heat conductivity by making the bonding member 3 thin, the semiconductor laser component is pressure bonded on the submount by the collet 4. Next, as shown in FIG. 1C, after the bonding member 3 is completely coagulated, the collet 4 releases the semiconductor laser component 1 and ascends. In this embodiment, the submount 2, on which the semiconductor laser component 1 is mounted, is heated again (reheated) up to a temperature greater than a melting point (183° C.) of the bonding member 3, after the conventional processes.

Next, advantages of the mounting method according to this embodiment will be described. In the conventional mounting method, since the semiconductor laser component 1 and the submount 2 are heated and bonded, a difference in temperature is generated from a period of completing coagulation of the bonding member 3 to a period of recovery to a normal temperature, and thus a residual stress due to a difference in thermal expansion coefficient is generated in the bonded portion. Furthermore, in order to secure enough bonding area between the semiconductor laser component 1 and the submount 2 sandwiching the bonding member 3 and to improve the heat conductivity by making the bonding member 3 thin, the semiconductor laser component is pressure bonded on the submount by the collet 4.

For this reason, since the semiconductor laser component 1 and the submount 2 is bonded to generate the stress, the stress due to the pressure bonding remains in the semiconductor laser component 1 even after the pressure bonding by the collet 4 is released. This residual stress increases due to the enlargement of the submount 2 and the increase of the bonding area accompanied with the high-power semiconductor laser component. In order to improve the heat releasing property, the submount 2 is bonded in the vicinity of a light emitting region of the semiconductor laser component 1, and as a result, the residual stress generated in the semiconductor laser component 1 is concentrated in the vicinity of the bonding surface with the submount 2. Therefore, the residual stress becomes higher in the light emitting region.

In general, when current flows in the semiconductor laser component 1 by applying a stress of 100 MPa or more to the light emitting region, crystals are transposed, which deteriorate the laser characteristic or destroys the semiconductor laser component 1. Conventionally, since the residual stress was small in the semiconductor laser component 1, the destruction of the semiconductor laser component 1 due to the crystal transposition did not occur. However, with the increase of the residual stress accompanied with the recent high power, the semiconductor laser component 1 is destroyed due to the crystal potential.

On the contrary, in this embodiment, in order to decrease the residual stress of the semiconductor laser component 1, the submount 2, on which the semiconductor laser component 1 is mounted, is heated again up to the temperature that is more than the melting point of the bonding member 3 after the conventional processes. By melting the bonding member 3 again, the bonding containing the stress of the semiconductor laser component 1 and the submount 2, which is a cause of the residual stress, is released, and thus the residual stress is released from the semiconductor laser component 1 and the submount 2.

Thereafter, when the bonding member 3 is coagulated by cooling again, the semiconductor laser component 1 and the submount 2 are bonded with release of the residual stress due to the pressure bonding of the collet 4. In addition, the pressure bonding by the collet 4 in the first heating, can make the bonding area between the semiconductor laser component 1 and the submount 2 secured sufficiently and the bonding member 3 can be made very thin. Thus, it is not necessary to carry out the pressure bonding by the collet 4 in the second heating process. In this embodiment as described above, since it is possible to decrease the residual stress of the semiconductor laser component 1 together with the required heat releasing property, it is possible to prevent the deterioration of laser characteristics or the destruction of the semiconductor laser component.

Furthermore, in the above embodiment, although the submount 2 is heated on the heating table 5, the same advantages can be obtained by using at least one selected from the group consisting of hot-air heating, ohmic-resistance heating or high-frequency heating. Furthermore, the heating may be carried out through the collet.

EXAMPLE 2

FIGS. 3A and 3B illustrate a first heating process and a second heating process in Example 2. The construction of the semiconductor laser device, the conventional mounting method, and the mounting process of this embodiment are similar to those in Example 1. This embodiment is different from Example 1 as follows. In Example 1, the first heating and the second heating operations are carried out using the same heating apparatus, but in this embodiment, an apparatus for the first heating operation is different from an apparatus for the second heating operation and a plurality of the semiconductor laser components is heated again together.

Next, advantages of the mounting method according to this embodiment will be described with reference to a comparison diagram in FIG. 4 which compares the mounting time according to Example 1 with that of Example 2. The problems of the conventional mounting method and the advantages in that the submount 2, on which the semiconductor laser component 1 is mounted, is heated again up to a temperature greater than the melting point of the bonding member 3 are similar to those in Example 1.

In Example 1, since the first heating operation and the second heating operation are carried out using the same heating apparatus, the mounting apparatus can be enlarged but the mounting time can be lengthened due to the second heating operation. In addition, since the second heating operation does not use the collet 4, the production efficiency decreases.

On the contrary, in this embodiment, since the first second heating operations are carried out using different heating apparatuses, the mounting apparatus is enlarged. However, the collet 4 can always be utilized, which makes it possible to prevent the decrease of production efficiency. As a result, as shown in FIG. 4, the mounting time is shortened more in this embodiment, and the shortened time increases in proportion to the number of semiconductor laser components to be produced.

Furthermore, since the semiconductor laser device is heated without using the collet 4 in the second heating operation, the heat capacity for heating can be saved more than in the case that the plurality of semiconductor laser components are simultaneously heated, and thus it is possible to reduce cost and to prevent the destruction due to increase in temperature of the mounting apparatus.

Furthermore, although in the above embodiment, a method of the first heating operation is the same as the second heating operation, the same advantages can be obtained even if the heating methods are different from each other. Furthermore, for the following reasons, it is more effective when the first heating operation is carried out by a contact type using the heating table and the like and the second heating operation is carried out by a non-contact type using hot-air heating and the like. Since the first heating operation is carried out by using the collet 4, the first heating operation cannot be carried out in a sealed space.

For this reason, a more efficient heating process is carried out by the contact type heating method. Since the second heating operation can be carried out in a sealed space, the contact type heating method and the non-contact type heating method do not render any difference in efficiency. However, when heating is carried out in a multi-layer arrangement as shown in FIG. 3B, a heating apparatus employing the contact type has a complex structure, but a heating apparatus employing the non-contact type can have a structure similar to the heating apparatus of a single-layer arrangement. As a result, the latter apparatus is not complicated.

It should be noted that a specific shape and structure of each part in the above embodiment is only an example of the present invention and thus does not limit the technical scope of the present invention.

What is claimed is:

1. A method of mounting a semiconductor laser component having a light emitting portion on a submount through a bonding member, the method comprising:
   setting the submount having a bonding member at a mount surface thereof on a heating table;
   heating the submount to bring the bonding member up to a temperature that is more than a melting point thereof;
   positioning the semiconductor laser component on the mount surface of the submount, wherein the semiconductor laser component is positioned by means of a collet;
   pressure-bonding the semiconductor laser component on the mount surface of the submount by the collet; and
   reheating the submount on the heating table without pressure by the collet after the bonding member is completely coagulated.

2. A method of mounting a semiconductor laser component on a submount through a bonding member according to claim 1, wherein, during the reheating operation, the bonding member is heated up to the melting point of the bonding member.

3. A method of mounting a semiconductor laser component on a submount through a bonding member according to claim 1, wherein a plurality of semiconductor laser components are bonded to a plurality of submounts, respectively, and the submounts are reheated together.

4. A method of mounting a semiconductor laser component on a submount through a bonding member according to claim 1, wherein a method of the first heating operation is different from that of the second reheating operation.

5. A method of mounting a semiconductor laser component on a submount through a bonding member according to claim 1, wherein the second reheating operation is carried out by at least one selected from the group consisting of hot-air heating, ohmic-resistance heating, and high-frequency heating.

6. A method of mounting a semiconductor laser component on a submount through a bonding member according to claim 1, wherein the bonding member is a Pb-free solder member.

7. A method of mounting a semiconductor laser component on a submount through a bonding member according to claim 1, wherein the semiconductor laser component is a GaN, GaAs or AlInGaP system semiconductor element, and the submount is made of Si or SiC.

* * * * *